United States Patent

[11] 3,624,640

[72] Inventor Robert Z. Geller
Wantagh, N.Y.
[21] Appl. No. 737,416
[22] Filed June 17, 1968
[45] Patented Nov. 30, 1971
[73] Assignee Inductsoyn Corporation
Carson City, Nev.

[54] MULTIPLE-SPEED POSITION-MEASURING SYSTEM
2 Claims, 4 Drawing Figs.

[52] U.S. Cl. .......... 340/347 AD, 340/347 DA
[51] Int. Cl. .......... H03k 13/02
[50] Field of Search .......... 340/347; 235/92; 318/605, 660, 594

[56] References Cited

UNITED STATES PATENTS

| | | | |
|---|---|---|---|
| 2,950,427 | 8/1960 | Tripp | 318/660 |
| 3,248,622 | 4/1966 | Kelling | 318/594 |
| 3,473,098 | 10/1969 | Waller | 318/594 |
| 3,174,367 | 3/1965 | Lukens | 235/92 X |
| 3,175,138 | 3/1965 | Kilroy et al. | 340/347 X |
| 3,349,230 | 10/1967 | Hartwell et al. | 340/347 X |
| 3,375,354 | 3/1968 | McGarrell | 340/347 X |
| 3,469,257 | 9/1969 | Hoernes et al. | 340/347 |
| 3,488,653 | 1/1970 | Rasche | 340/347 |

*Primary Examiner*—Maynard R. Wilbur
*Assistant Examiner*—Charles D. Miller
*Attorney*—William E. Beatty

ABSTRACT: A multiple-speed position-measuring system comprising a plurality of position-measuring devices of different significances, the relatively movable members of the devices being connected together for movement at the same mechanical speed. The improvement resides in supplying analog signals, at a certain frequency, to one of the devices, and supplying to other of the devices analog signals at frequencies harmonically related to the certain frequency, the devices thereby having sensitivities in proportion to the respective frequencies. For example, a device supplied with a fundamental frequency F may provide a coarse error signal, and another device supplied with the 25th harmonic (25F) may provide a fine error signal. Analog signals at harmonically related frequencies may be provided by appropriately filtering a rectangular wave signal produced by a digital to analog converter.

INVENTOR.
Robert Z. Geller
BY
Robert G Rogers
ATTORNEY

INVENTOR.
Robert Z. Geller
BY Robert G Rogers
ATTORNEY

INVENTOR.
Robert Z. Geller
BY Robert G. Rogers
ATTORNEY

MULTIPLE-SPEED POSITION-MEASURING SYSTEM

CROSS REFERENCE TO RELATED APPLICATION

U.S. Pat. Application Ser. No. 645,161 for a Digital to Analog Converter filed on June 12, 1967 by Robert W. Tripp, issued May 26, 1970 as U.S. Pat. No. 3,514,775.

BACKGROUND OF THE INVENTION

1. Field of the Invention

The invention relates to a digital to analog converter for producing analog signals having frequencies which are harmonics of each other from a digital number. Further, the invention relates to a multiple-significance position-measuring system employing a plurality of position-measuring devices the relatively movable members of which are connected together for movement at the same mechanical speed. By supplying analog signals of a different harmonically related frequency to each position-measuring device, the significance of the error signal produced by the device will be in proportion to the frequency supplied.

2. Description of Prior Art

It is well known that multiple-speed position-measuring systems provide a capability for operating over larger ranges and for developing measurements with higher accuracy. In a two-speed system, for example, a servomotor is driven by error signals from a coarse position-measuring device until the voltage magnitude is reduced below a certain level which is within one-quarter of the cycle of the fine position-measuring device.

When that level is reached, control of the servomotor is switched to the more sensitive position-measuring device until the error voltage is driven to zero. A plurality of position-measuring devices may be operated in synchronism in a particular system to increase the accuracy of the positioning system. However, depending on the total range and accuracy required, coarse and fine position-measuring devices may be adequate.

Examples of position-measuring devices include resolvers, potentiometers, and transformers comprising relatively movable and stationary winding members. One of the winding members of transformer devices may include a plurality of adjacent conductors connected in a series to form a continuous winding. A pole cycle (360 electrical degrees) may be defined as the center-to-center spacing of three adjacent conductors. Current in adjacent conductors flows in opposite directions.

The other winding member would include a plurality of continuous windings disposed on the other member in a geometric arrangement corresponding to a selected trigonometric relationship. Input signals to the windings correspond to the trigonometric relationship. For example, the windings may comprise two continuous windings displaced from each other by 90 degrees relative to the cycle of the continuous-winding member. The signals into the two continuous windings are electrically in phase with each other. Current flowing in the windings of one member is inductively coupled to the windings of the other member as a function of the relative positions of the members.

Additional details on transformers of the type described can be found by referring to U.S. Pat. No. 2,799,835, issued July 16, 1967 for a Position Measuring Transformer.

The movable members of the devices are connected to the driven part of the machine. If the input signals represent a command position, the servomotor drives the movable member of a device until the output or error signal from the devices is zero. When the error signal is zero, the driven part of the machine is at the required position.

The devices can also be used to determine the position of a drivable machine part by changing the input signals until the input signals represent the actual position of the machine part. The output error signal will become zero at that time and the position will have been determined.

In both applications, therefore, analog signals representing trigonometric functions of a position must be supplied to the devices. The same type of devices, resolvers, potentiometers, position-measuring transformers can be used to produce the signals. The signals may represent sine and cosine varying trigonometric functions. In addition, transformers comprising tapped windings may be combined to accurately generate signals representing trigonometric functions. A transformer system usable in generating precise signals is described in U.S. Pat. No. 2,849,668 for an Automatic Machine Control, issued Aug. 26, 1958 to R. W. Tripp.

In the system disclosed and claimed in U.S. Pat. No. 3,514,775, issued May 26, 1970, assigned to the assignee hereof, signals are produced by converting a digital number into analog signals representing trigonometric functions having amplitudes which are a function of an angle represented by the digital number.

Regardless of the system used to produce the input signals, in a multiple-speed system, one group of signals is required for the coarse-positioning device and another group of signals is required for the fine-positioning device.

The prior art systems usually depend on a difference in electrical or mechanical speeds with appropriate switching to achieve a coarse-fine relationship. Each device is synchronized with the other device so that preferably one speed is an exact multiple of the other. Because of inherent inaccuracies and machine tolerances, however, the preferred relationship is not always achieved.

U.S. Pat. No. 3,181,095, issued Apr. 27, 1965 and assigned to the assignee of the present application, is an example of a position-measuring transformer wherein separate sources of inputs are provided for windings of coarse and fine significances. It would be desirable to need only one source of input signal for windings of both coarse and fine significances and the present invention provides such a system by providing one generator and employing a fundamental frequency as well as a harmonic frequency for signals of different significances.

BRIEF DESCRIPTION OF THE INVENTION

Briefly, the invention comprises a system which converts a digital number into a plurality of analog signals. The signals have frequencies which are harmonics of each other and which have amplitudes as a function of an angle representing the digital number.

The system includes means for generating pulses on both sides of a reference position when the number equals the cyclical count of a counter. A reference position for the pulses may be selected as the beginning of the counting cycle of the counter. The pulses are symmetrical about the reference.

In a preferred embodiment, the pulses are used to actuate a gate for the interval between the pulses to provide a signal having an interval width as a function of the number.

The pulses are also stretched, or widened, and subsequently summed so that the amplitudes of the signals to be generated from the summed pulses are equal to the amplitudes of the signals to be generated from the gated signals.

The summed and gated signals are individually passed through a plurality of filters for generating signals representing trigonometric functions and cofunctions such as sine and cosine functions. The signals have frequencies which are multiples of the fundamental frequency as determined by the counter interval and which have amplitudes as a function of an angle representing the digital number and which are proportional to a particular harmonic.

Signals having one frequency may be used as input signals to one position-measuring device and signals having a harmonic frequency may be used as input signals to another position-measuring device. Since one group of input signals has a frequency which is a harmonic of the frequency of the other group, a precise ratio of frequencies and, therefore, a precise ratio of speeds of the device's results.

A switching device is used to switch control from one position-measuring device to another as a function of the magnitude of the error signal.

In a position-measuring system where the error signal is phase-detected against a reference signal, it may be desirable to filter the reference signal and use the filtered signals with error signals having the same frequencies. It is not necessary however.

As indicated in U.S. Pat. No. 3,514,775, pulses are generated on both sides of a reference to make the system relatively insensitive to phase shifts.

When pulses are stretched, as well as when a phase shift in the system causes a resultant shift in the reference position for a signal with the system, it may be necessary to shift the reference for the other signals in the system.

Therefore it is an object of the present invention to provide a multiple-speed position-measuring system incorporating position-measuring devices connected together for movement at the same mechanical speed, the devices being supplied with analog signals of different harmonically related frequencies, whereby the devices exhibit sensitivities in proportion to the respective frequencies.

It is another object of this invention to generate from a digital number a plurality of signals having frequencies which are accurate multiples of each other.

Another object of the invention is to convert a digital number into a plurality of signals having frequencies which are harmonically related to a reference signal.

Still another object of this invention is to develop from a digital number a plurality of signals having frequencies which are accurate multiples of each other and which have amplitudes as a function of an angle representing said number.

Still a further object of the invention is to convert digital numbers into pulses properly displaced from a reference for producing a plurality of analog signals representing trigonometric functions and which have harmonically related frequencies and amplitudes as a function of an angle representing the number.

A still further object of this invention is to provide a multiple-speed system in which the speed ratios are determined by the frequencies of related input signals.

It is still a further object of this invention to provide a multiple-speed position-measuring system using a plurality of analog signals having harmonically related frequencies as input signals to the system.

Another object of the invention is to provide a position-measuring system using a plurality of position-measuring devices having different electrical speeds as determined by the frequencies of harmonically related input signals.

These and other objects of this invention will become apparent from the description of preferred embodiments taken in connection with the drawings, a brief description of which follows.

BRIEF DESCRIPTION OF DRAWINGS

FIG. 4 illustrates the relationship of the signals produced by the FIG. 3 system, and wherein:

FIG. 4*a* represents the contents of a counter adapted to count repetitively through N counts;

FIG. 4*b* is a system reference signal;

FIG. 4*c* represents pulses spaced symmetrically about a reference phase of the counter cycle of FIG. 4*a;*

FIG. 4*d* shows the pulses of FIG. 4*c* delayed by N/4=90°;

FIG. 4*e* is a signal indicative of sine $\theta$ and derived from the pulses illustrated in FIG. 4*d;*

FIG. 4*f* and 4*g* represent the pulses of FIG. 4*c* each stretched to a width corresponding to 180°;

FIG. 4*h* represents a signal indicative of cosine $\theta$ and derived by summing the signals of FIGS. 4*f* and 4*g*;

FIGS. 4*i* and 4*j* show the fundamental frequency components of the signals of FIGS. 4*e* and 4*h*, respectively; and FIGS. 4*k* and 4*l* represent the 25th harmonic components of the signals shown in FIGS. 4*e* and 4*h*, respectively.

DESCRIPTION OF PREFERRED EMBODIMENTS

Figure 1:
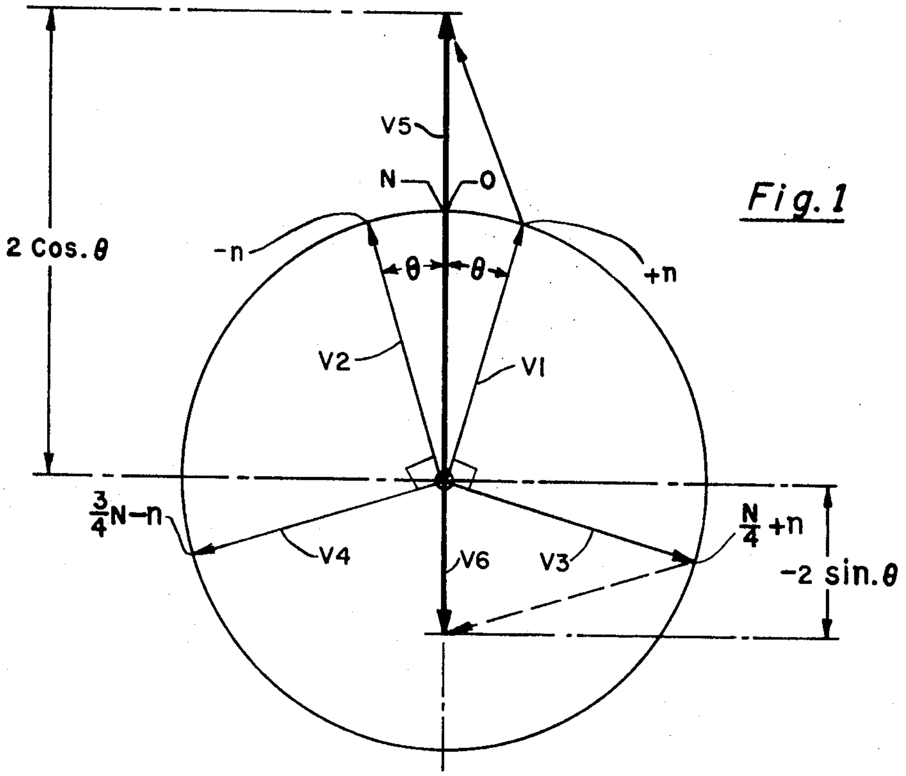
FIG. 1 illustrates a vector diagram of one method of combining vectors to produce trigonometric functions.

FIG. 1 illustrates one method of combining vector quantities to produce trigonometric functions and cofunctions. Vectors V1 and V2 are equally displaced on both sides of the reference (0) of the circle by an angle ($\theta$). The circle may represent N equal increments. Vector V1 may be vectorially added to vector V2 shown to produce vector V5 representing 2 cosine $\theta$ at the reference position.

It is known that sine and cosine functions are related by 90°. The cosine function has a maximum amplitude at, for example, a zero degree position and the sine function has a maximum amplitude at 90° with respect to the cosine function. Therefore, vectors representing a sine function can be generated from vectors displaced 90° from vectors V1 and V2. Vectors V3 and V4 respectively representing ¼N+*n* and ¾N−*n*, equally displaced 90° from the first vectors V1 and V2, are added to produce vector V6 representing 2 sine $\theta$ at the 180° position. If the resultant vector V6 is rotated 180°, the sine and cosine vectors V6 and V5 will have the same reference ($\theta$) although the magnitude of these vectors is related to the trigonometric functions they represent. It should be obvious, therefore, that vectors V1, V2, V3, and V4 having equal magnitudes and directed at angles $\theta$, $-\theta$, $\theta+90°$, and $-\theta-90°$ can be combined to produce vectors at the same reference position (o) and which have magnitudes as a function of the angle $\theta$ and the absolute value of the vectors being combined have a unit magnitude equal to the radius of the circle.

Figure 2:
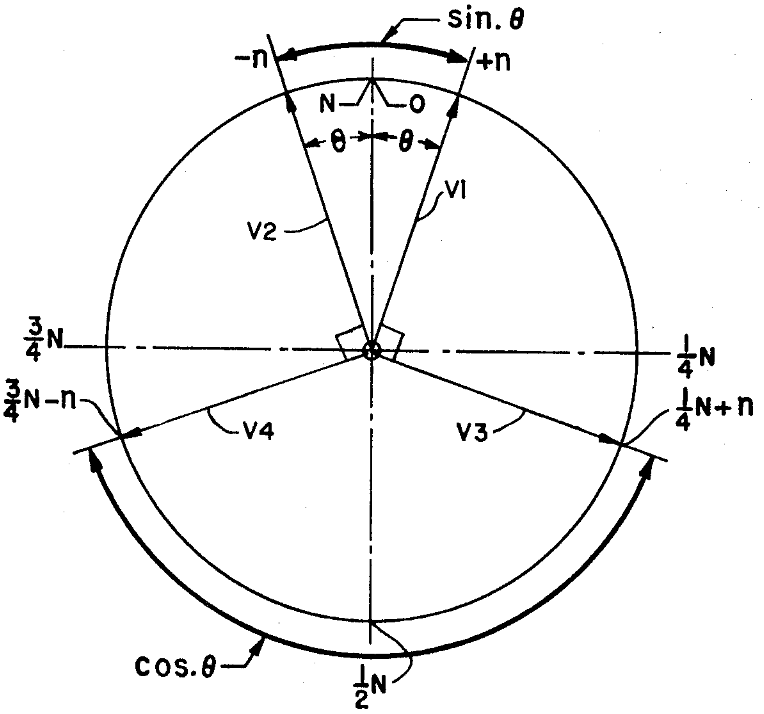
FIG. 2 illustrates a vector diagram of a second method of combining vectors to produce trigonometric functions.

FIG. 2 illustrates a similar diagram except that vectors V1, V2, V3, and V4 respectively representing *n*, −*n*, ¼N+*n*, ¾N−*n*, are combined in a different manner. The vectors occupy the same spatial position with respect to each other and the reference as shown in FIG. 1. It can be seen by the application of trigonometric identities that the interval between vectors V1 and V2 is proportional to sine $\theta$ and the interval between vectors V3 and V4 is proportional to cosine $\theta$. The same vectors were combined to produce the functions in reverse order from FIG. 1.

Since the circle may represent N equal increments, the angle $\theta$ can be defined by number *n* representing a point of the circle. Stated alternately, a number *n* may be represented by an angle $\theta$. As a result, in any system using the techniques illustrated by the vector diagrams, an input position can be defined in numerical form and operated on within a system in angular form. A digital number can be easily converted into an analog signal by a system which has a capability for combining signals representing the vector quantities.

It should be pointed out that the vectors V1 and V2 of FIG. 1 were vectorially summed to produce a vector V5 representing the cosine function and were combined in FIG. 2 to produce a vector V6 representing the sine function. Therefore, in order to produce the trigonometric function and cofunction, only one group, or pair, of vectors is necessary if the vectors are properly combined.

It should also be noted that only one vector V1 is required to produce both functions. As shown in FIG. 1, while both vectors V1 and V2 are vectorially summed to produce a resultant vector V5 proportional to 2 cosine $\theta$, if one vector V1 had been resolved into a component along the reference it would have been proportional to cosine $\theta$ and would have represented the same trigonometric function. Similarly, the arc between the vector V1 and the zero reference would be proportional to a sine function.

However, in a practical electronics system a signal representing a vector may be shifted in phase so that the angle $\theta$ may be changed between the input and output. Therefore, even though one number had been used as an input, in effect the number might be changed by system errors. The resulting output would be in error by the amount of the change.

If, however, two vectors are used, a shift in the angle $\theta$ would cause both vectors to be shifted in the same direction relative to the reference. The resulting vector would have the same magnitude except that the reference position would be changed by the amount of the shift in $\theta$. If the midpoint between the vectors is used as the reference a shift would have a negligible effect. The angle $\theta$ as well as the resulting vectors would remain the same. That effect can be used in an electronic system producing analog signals representing the resulting vector.

Figure 3:
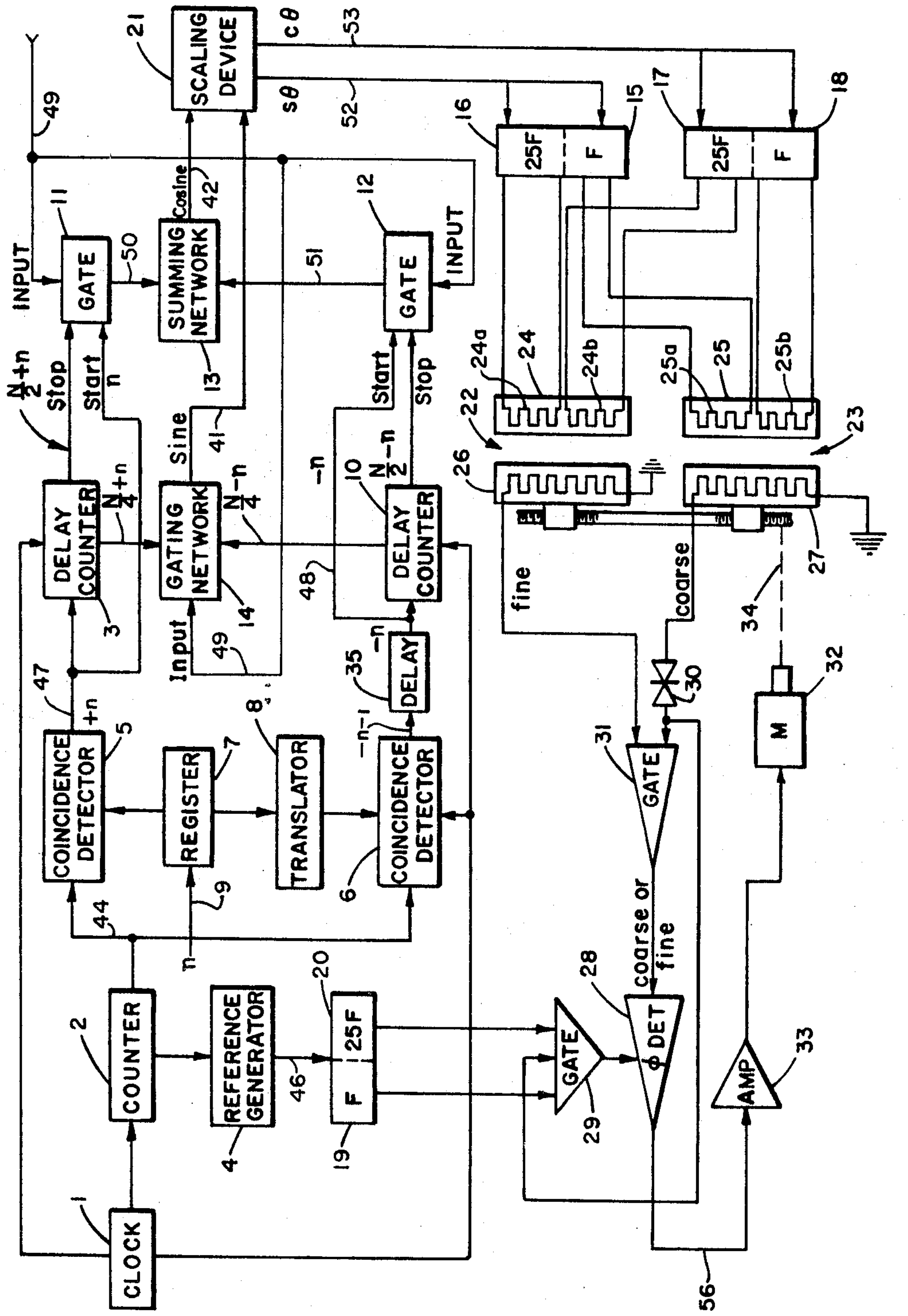
FIG. 3 illustrates a schematic diagram of one embodiment of a multiple-speed position-measuring system including means for producing harmonically related signals.

FIG. 3 shows a block diagram of one embodiment of the invention comprising clock 1 for generating pulses for the system. The pulses may have a frequency of NF as determined, for example, by a crystal-controlled oscillator, an RC network or other known circuits for generating clock signals.

The clock 1 has its output connected to the input of counter 2, which may comprise three binary-coded decimal (BCD) decade counters (not shown). The counters are connected together for cyclically counting clock pulses from clock 1 and for generating a signal on a channel 44 as a function of the count. Other counting devices such as binary counters, ring counters, and the like may also be used in the system. The specific example, is given for purposes of illustration only.

If a counting interval, N of 1,000, for example, is selected, the zero reference would be contained in the counter 2 as 000 where zeros would appear in each stage of the counter. The upper limit would be contained in the counter 2 as 999. The output from the counter 2 may be presented by a ramp function shown at 2 in FIG. 4*a*. The counter 2 counts each clock pulse until a count of N is reached, at which time counter 2 resets itself to zero and initiates a new cycle.

The counter 2 also has an output to reference generator 4. The reference generator which may be mechanized by standard logic gates and flip-flop circuitry (not shown), generates an output reference signal on a line 46 in response to the count 2 in the counter. At a particular count, the logic receiving the signals from the counter sets or resets a flip-flop in the circuit to change the state of an output signal.

The signal on line 46 may be in the form of a square wave which has its reference at the zero count, or reference position, of the counter 2 as shown more clearly at 46′ in FIG. 4*b*. In other embodiments, the reference position of the reference signal may be shifted to a different position relative to the counter output 2′ in order to maintain signal alignment within the system.

The counter 2 output is connected to coincidence detectors 5 and 6 which compare the count from the counter with the contents of register 7 and output of a translator respectively. The nines complement of the contents of register 7 is used in describing the embodiment shown in FIG. 3, since the nines complement is easily obtained by use of passive logic gates. One-count delay device 35, such as a flip-flop, is used to correct the one-count discrepancy in order to convert the nines complement to a tens complement, or $-n$.

Throughout this description where the output of coincidence detector 6 is described as being $-n$, it should be assumed as shown in FIG. 3 that the output is $-n-1$ for reasons indicated above. It should also be assumed that the one-bit discrepancy is corrected by delay device 35.

The coincidence detectors 5 and 6 may be one-eighth by logic gates (not shown) which receive inputs from the counter 2 proportional to the count. When the count is equal to the numbers received from register 7 and translator 8 respectively, the gates are turned on to produce an output pulse from the respective detector 5 or 6. The $+n$ and $-n$ pulses, on respective lines 47 and 48 are displaced from the counter reference 0 by a number of counts equal to counts of $n$ and $-n$. Assuming a counter interval of 1,000 (0–999), if the number $n$ had been 125 or one-eighth of the interval, a pulse representing $+n$ would have been generated as an output from detector 5 at the 125th counter interval. Similarly, a pulse representing $-n$ would have been generated at the −125th count, or in a positive notation, at the 874th counter interval from the reference. Pulses designated $+n$ and $-n$ are, therefore, generated on both sides of the zero reference and are equally displaced from the reference as shown in FIG. 4*c* for an input number 125.

Coincidence detectors 5 and 6 receive inputs from register 7 and translator 8 respectively. Register 7 may be comprised of a three-stage storage register mechanized by logic gates and flip-flops (not shown) for storing the decimal number $n$ in binary-coded decimal form. The number may be placed in the register on its input line 9, either manually or automatically as, for example, from a computer, storage tapes, card, etc. A binary-coded decimal numerical form is used in this description although it should be obvious that other numerical forms such as binary can also be used without departing from the scope of the invention.

In addition to providing an output for coincidence detector 5, the register 7 also provides an output to translator 8. Translator 8 provides an output which is a function of the complement of the contents of register 7. In effect, the number stored in register 7 is translated to the other side of the reference position by a distance equal to the spacing of $n$ from the reference zero.

The output from the translator 8 is compared with the count from counter 2. When there is coincidence as described above, a pulse representing $-n$ is generated on line 48.

The translator 8 may comprise fixed logic gates which are connected for receiving the number $n$ and for generating the complement of that number. In effect, the gates are connected to subtract the number $n$ from a number $n$ representing the counter 2 interval. Logic circuitry for converting from one number to another number is considered well known in the art.

The outputs from coincidence detectors 5 and 6 are connected to delay counters 3 and 10 and to logic gates 11 and 12. The delay counters may comprise a plurality of decade counters connected together for developing a cyclical count equal to, for example, the count of counter 2.

For the particular embodiment shown, pulses $n$ and $-n$ are delayed through the delay counters 3 and 10 by one-half and one-fourth of the counter interval N. In other words, the delay counters 3 and 10 have two outputs, one delayed by one-half and the other delayed by one-fourth of the counter 2 interval. Each delay counter 3 and 10 counts clock pulses until pulses equal in number to the delays required have been counted, at which time the counter passes the delayed pulses. In other embodiments, the amount of delay can be increased or decreased as required for a particular application.

The purpose of the delay is to equalize the relative amplitudes of the signals produced from summing network 13 and gating network 14 and to reestablish the reference of the signals from gating network 14. A more detailed description of the delay and the requirement for changing the reference is described in connection with FIG. 4.

Signals from the delay counters 3 and 10 and the coincidence detectors 5 and 6 actuate gates 11 and 12. The gates 11 and 12 are turned on when a start pulse is received from the respective coincidence detector 5 or 6 and turned off respectively after an interval of time equal to N/2, when a stop pulse is received from the respective delay counter 3 or 10.

The output pulses 50′ or 51′ from gates 11 and 12, on respective line 50 and 51, are shown in FIG. 4*f* and *g*. As indicated in the figures, the pulse intervals begin at $-n$, and $+n$ respectively and terminate at $-n$+N/2 and $+n$+N/2 respectively. In effect, input signals 50′ and 51′ from the gates 11 and 12 are passed to summing network 13 during the period that the gates 11 and 12 are turned on. The output from the summing network 13 is shown in FIG. 4*h*.

The input signals on line 49 to the gates 11, 12 and 14 may have a direct signal or an alternating-signal level. For example, the clock signal may be used as an alternating signal.

Summing network 13 may be comprised of state of the art gating logic (not shown) for adding the signals received from gates 11 and 12. The summed output signal on a line 42 is an analog signal 42′ representing a cosine trigonometric function, as shown in FIG. 4*h*. The rectangular signal comprises a plurality of harmonically related components having amplitudes proportional to the cosine of angle $\theta$ and to the particular harmonic involved. The angle $\theta$ represents the fraction of the counter interval that the number $n$ is displaced from the reference.

Gating network 14 is connected to receive the pulses $+n$ and $-n$, each delayed by an amount N(4, from the delay counters 3 and 10. The pulses were delayed by an amount N/4, equal to one-half of the increase in width of the pulses into the summing network 13. The delayed pulses are shown in FIG. 4*d*. As a result of using delayed pulses, the reference of the output signal from gating network 14 remains the same as the reference of the output signal from summing network 13. In other words, if pulses were spaced, in effect 45° from the reference and delayed 180° (n/2), the reference position (0) would be shifted to 90° (N/4). If each pulse into gating network 14 is delayed by N/4 from its original position, the reference position between the pulses into gating network 14 would also be 90°.

Gating network 14 may also be comprised of state of the art logic networks which are turned on when a pulse N/4$-n$ is received and turned off when a pulse N/4$+n$ is received. As a result, an analog signal 41′ representing the sine trigonometric function is produced on a line 41. The signal 41′ is shown in FIG. 4*e*. The rectangular signal 41 comprises components having amplitudes proportional to the sine of an angle $\theta$ between the zero reference and pulse $n$. Signals at the harmonic frequencies have amplitudes related to the particular harmonic.

It should be obvious that pulses representing $+n$ and $-n$ are comparable to vectors V1 and V2 of FIGS. 1 and 2. Both vectors and pulses $+n$ and $-n$ are equally displaced on both sides of the zero reference by an amount equal to the fraction of the counter 2 interval represented by a number $n$. The sine and cosine rectangular signals 41′ and 42′ (FIG. 4*e* and 4*h* respectively) represent the combined vectors V1 and V2 of FIGS. 1 and 2. In FIG. 1 the vectors V1 and V2 were summed as were the widened $-n$ and $+n$ pulses in summing network 13. In FIG. 2 the vectors V1 and V2 were combined as were the delayed $+n$ and $-n$ pulses in gating network 14.

It can be shown that the rectangular waves from the gating and summing networks 14 and 13 are comprised of sine and cosine varying signals at the fundamental frequency of the rectangular waves and at harmonics of the fundamental frequency. The following equations (1) and (2) illustrate the relative amplitudes of the components comprising the sine and cosine rectangular waves respectively:

Sine $$C_h=\frac{2A}{h\pi}\sin\pi\frac{hm}{N} \qquad (1)$$

Cosine $$C_h^1=\left(\frac{2A}{h\pi}\sin\frac{\pi h}{2}\right)\cos\pi\frac{hn}{m} \qquad (2)$$

Where $C_h'$ = the amplitude of the $h^{th}$ harmonic of the sine rectangular wave signal, $C_h'$ = the amplitude of the $h^{th}$ harmonic of the cosine rectangular wave signal, $N$ = one cycle of the rectangular wave, and $A$ = the maximum amplitude of the signal, $m$ = the period when the amplitude of the wave is $A$.

The cosine signal from the summing network 13 comprises two rectangular waves whereas the sine signal from the gating network 14 comprises one rectangular wave. Therefore, the fundamental and harmonic frequency components which can be derived from the cosine signal are relatively larger than components for the same angles which can be derived from the sine signal. Scaling in a scaling device 21 is necessary to equate the magnitudes.

By solving the equations for various harmonics 1 through 5 and 25, the following chart can be prepared.

| Harmonic | Sine Term | Cosine Term |
|---|---|---|
| 1 | K sine $\theta$ | K cos $\theta$ |
| 2 | (K/2) sine $2\theta$ | 0 |
| 3 | (K/3) sine $3\theta$ | (K/3) cos $3\theta$ |
| 4 | (K/4) sine $4\theta$ | 0 |
| 5 | (K/5) sine $5\theta$ | (K/5) cos $5\theta$ |
| 25 | (K/25) sine $25\theta$ | (K/25) cos $25\theta$ |

Where $K=2A/\pi$ and $\theta=m/N$

The equations can also be solved for other harmonics although it was not believed necessary to solve the equations for additional harmonics for purposes of this description. It is noted that only odd harmonics are available from the cosine signal.

The output signals from gating network 14 and summing network 13 are connected to scaling network 21. The signals are scaled so that the amplitudes of the fundamental and harmonic frequency components are related to each other as determined by the trigonometric functions represented by the signals 41′ and 42′. The necessity for scaling was described previously.

A voltage divider network may be used to scale the signals. Other circuits known to persons skilled in the art can also be used to scale the voltage levels of the signals.

The exact scaling factor can be determined mathematically by a Fourier analysis of the rectangular waves. In addition, the scaling factor could be determined empirically by reducing the voltage level of the cosine signal across a potentiometer until the sinusoidal signals derived from the rectangular wave are equal in amplitude. The scale factor would require a redetermination if the pulse delay intervals were subsequently changed.

Scaling device 21 is connected to filter networks 15, 16, 17, and 18. The sine and cosine rectangular wave signals on lines 52 and 53 are filtered to provide components which have desirable frequency ratios. Networks 16 and 17 are filters for components at the fundamental frequency F and networks 15 and 18 are filters for the components at the 25th harmonic (25F) of the fundamental. The particular frequencies are selected by way of illustration only. The third and 15th harmonics as well as other combinations could also be used. The filters would have to be changed accordingly.

The fundamental frequency F is determined by the counter 2 interval and may be for example, 2 kilocycles per second. The 25th harmonic would have a frequency of 50 kilocycles per second. FIGS. 4*i* and 4*j* illustrate the outputs of filter networks 15 and 18, respectively showing the fundamental frequency components of the sine and cosine rectangular wave signals supplied to networks 15 and 18 on lines 52 and 53. Examples of the 25th harmonic of the sine and cosine signals are shown in FIGS. 4*k* and 4*l* respectively; these signals correspond to the outputs of filter networks 16 and 17, respectively.

Filters of a type usable as filter networks 16 and 17 for obtaining signals at harmonic frequencies may be formed by placing a low-pass filter section having one cutoff frequency in series with a high-pass filter section having another cutoff frequency. If the frequencies required for a particular application fall between the cutoff frequencies of the filters, only those frequencies will be passed. Alternatively, a band-pass filter could be designed to pass the 25th harmonic and a low-pass filter could be used to pass the fundamental.

Filters are described and shown in the book entitled "Alternating Current Circuits," pp. 455–487, by Russell M. Kerchner and George F. Corcoran, published by John Wiley & Sons, 1955.

The filter network 15, 16, 17 and 18 are shown interposed between the scaling network and position-measuring devices 22 and 23. It should be noted, however, that the filters could be placed at other locations with the system. For example, the filters could be relocated between the position-measuring devices and gate 31, thus requiring fewer filters.

Filter networks 19 and 20, connected between the reference generator 4 and the phase detector 28, respectively are similar to the filter networks 15, 18 and 16, 17 described in connection with the sine and cosine signals. It should be noted however that the reference signals on line 46 are usable in phase detectors without filtering to generate error signals at frequencies equivalent to the signals into the detectors from the filters.

Filters 15 through 18 are connected to position-measuring devices 22 and 23, which are illustrated as linear position-measuring transformers. Each transformer 22 and 23 has input windings 24*a*, 24*b* and 25*a*, 25*b* geometrically spaced according to the trigonometric relationship of the input signals.

Since the signals supplied to devices 22 and 23 represent sine and cosine functions, the windings 24*a*, 24*b* and 25*a*, 25*b* of each member 24 and 25 are displaced from each other by 90 electrical degrees relative to the electrical cycle established by the continuous winding of each of the members 26 and 27. The output members 26 and 27 are connected to shaft 34 and are movable relative to the windings of the input members at the same mechanical speed. When the windings move relative to each other, electrical signals as a function of the relative positions of the movable members 26 and 27 and stationary members 24 and 25, are inductively coupled to the output windings.

If signals representing different trigonometric functions were produced, position-measuring devices having different groups of windings with different geometrical spacing may be required. Although linear position-measuring transformers are illustrated, rotational devices may also be used.

Position-measuring transformers which can be used within the scope of this invention are described in U.S. Pat. No. 2,799,835, issued on July 16, 1957 for a Position Measuring Transformer.

Measuring device 23 is connected to filters 15 and 18 which pass sine and cosine components at the fundamental frequency. Measuring device 22 is connected to filters 16 and 17 for 25th harmonic components. Because of the different frequencies, device 22 has 25 null positions for each null position of device 23 when the input and output windings are moved relative to each other. As a result, device 23 comprises the coarse position-measuring device and device 22 comprises the fine position-measuring device.

Positioning-measuring device 22 is connected directly to gate 31 which passes either the fine-positioning signal from device 22 or the coarse-positioning signal from device 23 to phase detector 28. Measuring device 23 is connected to switching device 30, shown as a Zener diode, to disconnect the coarse signal from the gate 31 when the magnitude of this coarse signal falls below a certain minimum voltage level.

Gate 29 is interposed between filter network 20 and phase detector 28 for connecting either the fine reference signal from filter network 20 or the coarse reference signal from filter network 19 to the detector 28 depending on whether detector 28 is receiving the fine- or coarse-positioning signal. Gate 29 passes a coarse reference signal when the Zener diode 30 is conducting and a fine reference signal when diode 30 is not conducting.

Other switching devices such as a relay circuit could be used in lieu of the Zener diode.

Gate 31 is connected to phase detector 28 which receives the appropriate reference signal and either a coarse or fine position signal representing the relative position of the transformer 22 or 23 members. If the signals from the position-measuring devices 22 or 23 are not zero, the phase detector 28 generates an error signal on a line 56 to amplifier 33 and motor 32. The motor 32 causes shaft 34 to move members 26 and 27 until the output voltage from phase detector 28 is reduced to zero.

Figure 4:
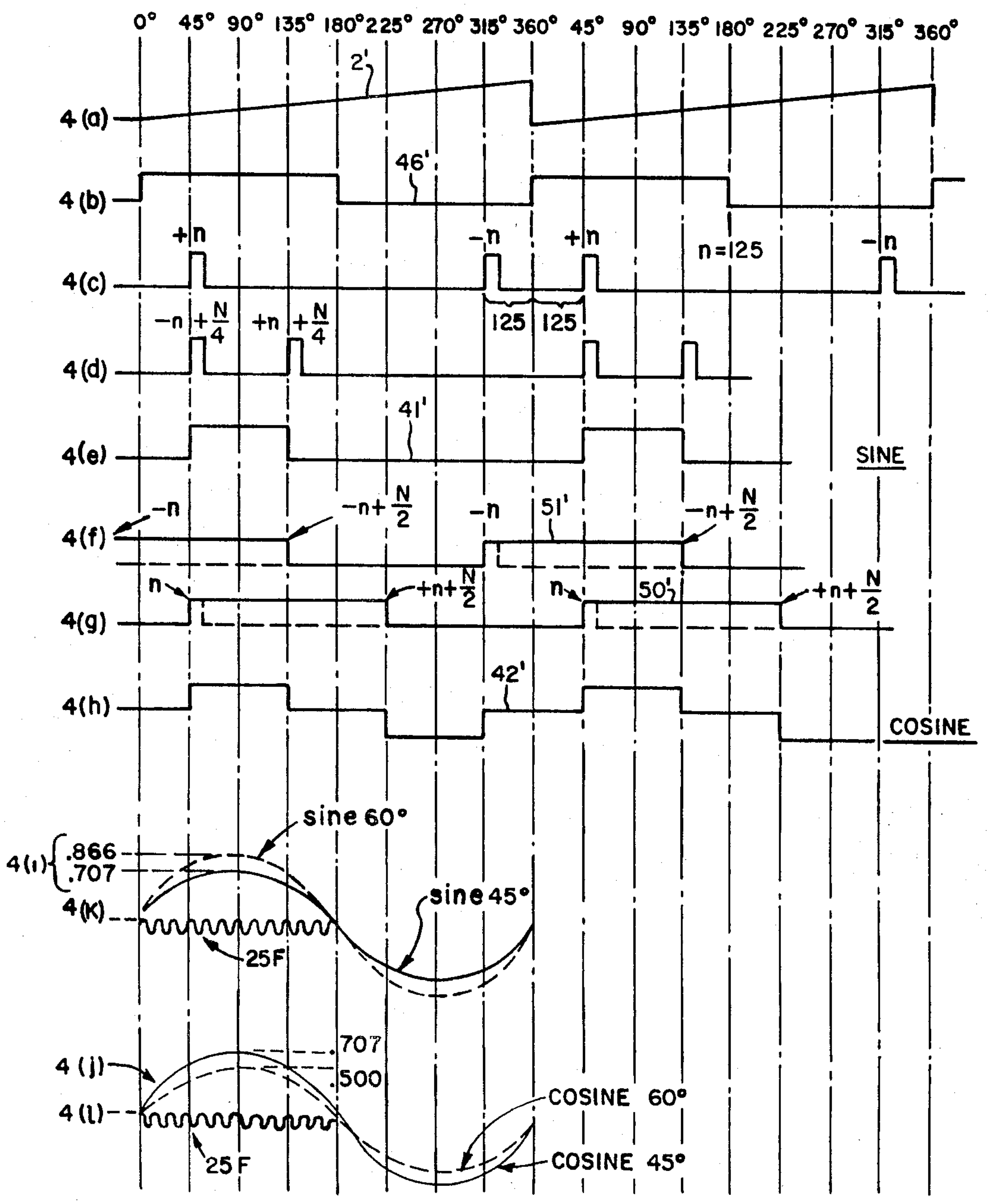

A brief description of the operation of the system can be given in connection with FIG. 4 in view of FIG. 3. As indicated in FIG. 4*a*, the counter 2 increases over an interval from 0 to N by increments, each time a clock pulse is received.

The reference signal 46 shown in FIG. 4*b* is set relatively positive at zero degrees and is set relatively negative at 180° in response to the 0 and 500 counts of the counter 2. The 500th count is equal to one-half the counter 2 cycle. The reference signal is symmetrical about the 90° position which is also the point of symmetry for other signals of the system following the shift due to widening the pulses into summing network 13. Before the shift, equivalent to N/4 or 90°, the reference or point of symmetry was at zero degrees.

Assuming an input of $n$=125, or 45°, pulse $+n$ is generated by the detector 5 at the 125th interval of the counter cycle. Subsequently, at the 875th interval, pulse $-n$ is generated on line 48. Both pulses $+n$ and $-n$ are shown in FIG. 4*c*.

The respective $+n$ and $-n$ pulses are delayed by delay counters 3 and 10 for one-quarter of the counter 2 interval and as a result, are shifted to the new positions as shown in FIG. 4*d*. The pulses turn gating network 14 off at 45°+N/4 and on at 315°+N/4 for the input number $n$=125. FIG. 4*e* represents the resulting sine trigonometric function symmetrical about the 90° reference position.

Pulses $+n$ and $-n$ are widened by gates 11 and 12 respectively as shown in FIGS. 4*g* and 4*f*. In FIG. 4*f*, the $-n$ pulse is increased to a width equivalent to N/2. Gate 12 is turned on by the $-n$ pulse and is turned off at N/2 or 180° later. Similarly, as shown in FIG. 4*g*, gate 11 is turned on by the $+n$ pulse and is turned off 180° later.

The stretched pulses 50' and 51' are added in summing network 13 as shown in FIG. 4*h* and occupy an area from 315° to 225°. Between 45° and 135°, the pulses overlap. A portion of the amplitude may be required to be removed as previously described in order to make the relative amplitudes of the sine and cosine components produced from the rectangular waves equivalent. However, if the pulses are the exact amount required in order to provide relatively equal components, scaling may not be required. The cosine signal 42' is also symmetrical about the 90° point.

The coarse signals from filters 15 and 18 are shown by the solid line curves in FIGS. 4*i* and 4*j* for sine and cosine signals respectively. Since the input was 45°, both amplitudes are equal. If the input had been 60°, the amplitudes would have been changed as indicated by the dashed lines.

The 25th harmonic signals (fine) are also shown in FIG. 4*k* and 4*l* for the sine and cosine signals respectively. The reference signals from filters 19 and 20 for the fundamental and 25th harmonic are not shown. The signals would be similar to the sine and cosine signals with different amplitudes.

While the measuring devices 22 and 23 have been referred to as separate elements, they may be considered as parts of a unitary position-measuring device wherein the continuous winding members 26 and 27 are fixed with respect to each other but movable relatively to the stationary fine and coarse winding members 24 and 25, the member 24 having a fine winding for the sine and a fine winding for the cosine, those windings having inputs of 25F, the member 25 having windings of coarse significance receiving frequency F for both the sine and the cosine.

Although the invention has been described and illustrated in detail, it is to be understood, that the same is by way of illustration and example only, and is not to be taken by way of limitation. The spirit and scope of the invention is limited only by the terms of the appended claims.

I claim:

1. Multiple-speed position-measuring system including a digital-to-analog converter, a position-measuring device having inductively related, relatively movable members supplying an analog signal for controlling a servomotor in accordance with a digital input supplied to said converter, the improvement wherein said converter includes means for supplying trigonometrically related signals each of a plurality of harmonically related first and second frequencies, and means for supplying said first and second frequencies as inputs of corresponding grades of sensitivity to one of said relatively movable members of said position-measuring device, whereby the other member of said position-measuring device produces a corresponding plurality of error outputs for controlling said servomotor, said digital-to-analog converter including means for generating at least one pair of pulses symmetrically disposed on each side of a cyclically recurring reference position, first means responsive to one pair of said pulses for producing a first plurality of analog signals having frequencies harmonically related to the cyclical recurrence rate of the reference position, each of said analog signals representing a trigonometric function having an amplitude as a function of the position represented by said digital input, and second means responsive to said one pair of pulses for producing a second plurality of analog signals having frequencies harmonically related to the cyclical recurrence rate of the reference position, each of said second plurality of signals representing a trigonometric cofunction of said trigonometric function having an amplitude as a function of the position represented by said digital input.

2. A system according to claim 1, wherein said cyclical recurrence rate determines the fundamental frequency of said first and second pluralities of signals, said first and second signals each comprising signals at the fundamental frequency and signals at an odd harmonic of said fundamental frequency, said harmonic signals having amplitudes proportional to the amplitude of the fundamental signal.

* * * * *